United States Patent [19]

Yamakoshi et al.

[11] 4,347,531
[45] Aug. 31, 1982

[54] CIRCUIT CONVERTING A PAIR OF DIFFERENTIAL INPUT SIGNALS TO SINGLE-ENDED OUTPUT SIGNALS

[75] Inventors: Akira Yamakoshi, Saitama; Kyoichi Murakami; Tsutomu Niimura, both of Kanagawa, all of Japan

[73] Assignee: Sony Corporation, Tokyo, Japan

[21] Appl. No.: 186,706

[22] Filed: Sep. 12, 1980

[30] Foreign Application Priority Data

Sep. 20, 1979 [JP] Japan .............................. 54-121341

[51] Int. Cl.$^3$ ............................................. H04N 5/18
[52] U.S. Cl. .................................... 358/172; 330/261
[58] Field of Search ..................... 358/172; 330/11, 69, 330/252, 261; 307/237

[56] References Cited

U.S. PATENT DOCUMENTS 4,178,558  12/1979  Nagashima et al. ................. 358/172

*Primary Examiner*—Richard Murray
*Attorney, Agent, or Firm*—Lewis H. Eslinger; Alvin Sinderbrand

[57] ABSTRACT

A signal converting circuit, which has particular application as a pedestal clamp circuit for a video signal, includes a differential amplifier having a pair of transistors which produce first and second differential currents at the respective collectors thereof; a first circuit supplied with the first differential current and including a diode and a first resistor having a first resistance value connected in series between the collector of one of the transistors of the differential amplifier and a reference potential; a second circuit supplied with the second differential current and including a second resistor having a second resistance value and a transistor having its collector emitter path connected in series with the second resistor between the collector of the other transistor of the differential amplifier and the reference potential; and an output circuit for producing an output current in response to the second differential current and including a current mirror transistor having its base-collector path connected in parallel with the collector-emitter path of the transistor of the second circuit, wherein the current gain of the signal converting circuit is controlled by the resistance values of the first and second resistors.

15 Claims, 4 Drawing Figures

CIRCUIT CONVERTING A PAIR OF DIFFERENTIAL INPUT SIGNALS TO SINGLE-ENDED OUTPUT SIGNALS

BACKGROUND OF THE INVENTION

1. Field of the Invention

This invention relates generally to a signal converting circuit and, more particularly, is directed to a signal converting circuit for converting a pair of differential input signals to a single-ended output signal.

2. Description of the Prior Art

Signal converting circuits, for example, of the differential amplifier type, for converting a pair of differential input signals to a single-ended output signal are well-known in the art. One such signal converting circuit includes a pair of transistors which form a differential amplifier. A bias current source is supplied to the commonly connected emitters of the pair of transistors and differential input signals are supplied to the respective inputs of the transistors. Accordingly, differential output currents are produced by the transistors at the collectors thereof and are used to generate a single-ended output signal.

With such circuit, however, in order to avoid any deleterious effect on the differential output currents, it is undesirable to directly utilize such differential output currents in the next stage. In this regard, a current mirror circuit is conventionally used with such differential amplifier circuit whereby changes in at least one of the differential output currents is reflected by identical changes in the output current of the current mirror circuit. For example, one such current mirror circuit includes a diode connected between a voltage source and the output of one of the transistors of the differential amplifier and a PNP transistor having its base-emitter path connected in parallel with the diode. The collector of the PNP transistor serves as the output terminal for producing an output current corresponding to that produced at the output of the one transistor of the differential amplifier.

However, such circuit has proven to be disadvantageous if the emitter area of the PNP transistor of the current mirror circuit is N times larger than the area of the cathode of the diode used therein. In such case, the current produced at the collector of the transistor of the current mirror circuit is equal to N times the current flowing through the diode. This, of course, is undesirable and results in an increased current being supplied to the next stage of circuitry and an increased power consumption from the voltage source connected to the diode of the current mirror circuit. In this manner, it becomes exceedingly difficult to amplify the input signals. Further, in order to vary the gain or amplification of the signal converting circuit, it is necessary to increase the value of the constant current from the current source of the differential amplifier, which is also undesirable.

OBJECTS AND SUMMARY OF THE INVENTION

Accordingly, it is a principal object of this invention to provide a signal converting circuit which avoids the above-described difficulties encountered in the prior art.

More particularly, it is an object of this invention to provide a signal converting circuit in which the gain thereof can be controlled by varying one or more resistance values of resistive elements in the circuit.

Another object of this invention is to provide a signal converting circuit of the differential amplifier type in which the gain thereof can be controlled without varying the value of a constant current generated by a constant current source of the differential amplifier.

Still another object of this invention is to provide a signal converting circuit of the differential amplifier type which is actuated by periodic signals and which supplies a continuous output signal in response thereto.

Yet another object of this invention is to provide a signal converting circuit of the differential amplifier type which is actuated by periodic signals and in which the DC transfer characteristic thereof can be controlled without using time constant circuits.

In accordance with an aspect of this invention, a signal converting circuit includes differential amplifier means for producing first and second differential currents, a first circuit supplied with the first differential current and including first resistive means having a first resistance value; a second circuit supplied with the second differential current and including second resistive means having a second resistance value; and output means for producing an output current in response to one of the first and second differential currents, wherein the current gain of the signal converting circuit is controlled by the resistance values of the first and second resistive means.

The other objects, features and advantages of the invention will be apparent in the following detailed description of illustrative embodiments of the invention which is to be read in connection with the accompanying drawings.

DETAILED DESCRIPTION OF THE PREFERRED EMBODIMENTS

Figure 1:
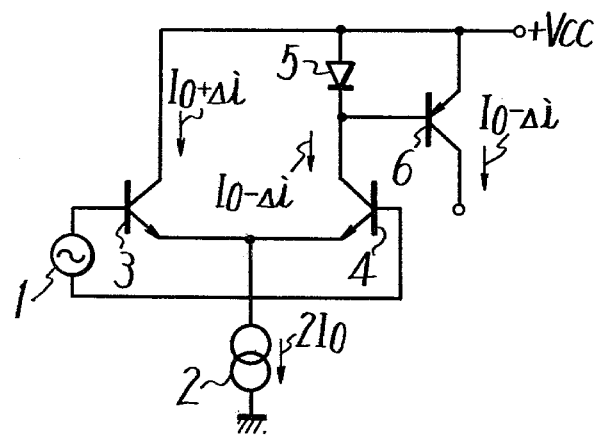
FIG. 1 is a circuit wiring diagram of a signal converting circuit according to the prior art.

Referring to the drawings in detail, and initially to FIG. 1 thereof, there is shown a signal converting circuit of the differential amplifier type according to the prior art for converting a pair of input signals to a single-ended output signal. As shown therein, the circuit includes two NPN transistors 3 and 4 which form a differential amplifier and have their emitters connected in common to ground through a constant current source 2 which generates a constant current $2I_0$. The bases of the transistors are connected to an input signal generator 1 which supplies differential input signals thereto. The collector of transistor 3 is connected to a voltage source $+V_{CC}$ and the collector of transistor 4 is also connected to voltage source $+V_{CC}$ through a diode 5. In particular, the anode of diode 5 is connected to voltage source $+V_{CC}$ and the cathode thereof is connected to the collector of transistor 4. A PNP transistor 6 has its emitter-base circuit connected in parallel with diode 5 between voltage source +V$_{CC}$ and the collector of transistor 4 and the output of the signal converting circuit is taken at the collector of transistor 6. More particularly, diode 5 and transistor 6 form a current mirror circuit in which the current through diode 5 is mirrored by the collector current of transistor 6. It should be appreciated that the use of a current mirror circuit in the signal converting circuit of FIG. 1 has the advantage that current at the collector of transistor 6 may be measured or used in additional stages without deleteriously affecting the current at the collector of transistor 4.

If no input signal from input signal generator 1 is supplied to the bases of transistors 3 and 4, these transistors become biased so that a constant current I$_0$ flows through each of the collectors thereof from constant current source 2. However, when differential input signals from signal generator 1 are supplied to the bases of transistors 3 and 4, respectively, the collector currents of transistors 3 and 4 change to (I$_0$+Δi) and (I$_0$−Δi), respectively. Since diode 5 and transistor 6 form a current mirror circuit, the current along the emitter leg of transistor 6 is equal to the current (I$_0$−Δi) through diode 5. Further, since the collector current of transistor 6 is substantially equal to the emitter current thereof, the output current of the signal converting circuit of FIG. 1, at the collector of transistor 6, is also equal to (I$_0$−Δi).

It should be appreciated, however, that with the circuit of FIG. 1, the input signals cannot selectively be amplified if, for example, the emitter area of transistor 6 is N times larger than the area of the cathode of diode 5. In such case, the output current obtained at the collector of transistor 6 is equal to N (I$_0$−Δi). This, of course, is undesirable, since bias current I$_0$ is multiplied by a factor of N, resulting in an increased current being supplied to the next stage and resulting in increased power consumption from voltage source +V$_{CC}$. Further, with this circuit, in order to amplify the current at the output of transistors 4 and 6, the value of the constant current from current source 2 must be increased, which is also undesirable.

Figure 2:
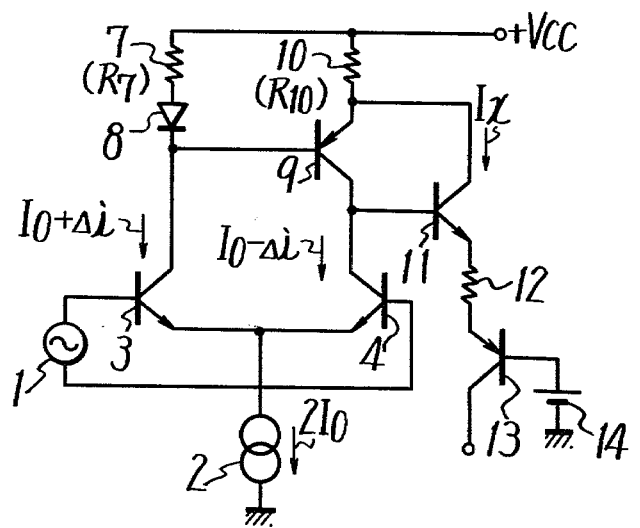
FIG. 2 is a circuit wiring diagram of a signal converting circuit according to one embodiment of this invention.

Referring now to FIG. 2, a signal converting circuit according to one embodiment of this invention will now be described, in which elements corresponding to those described above with reference to the prior art circuit of FIG. 1 are identified by the same reference numerals. The signal converting circuit of FIG. 2 includes a differential amplifier comprised of transistors 3 and 4 supplied at the bases thereof with respective differential input signals from input signal generator 1 and which are phase-inverted with respect to each other. The emitters of transistors 3 and 4 are commonly connected to ground through current source 2 which generates a constant current 2I$_0$. Further, the collector of transistor 3 is connected to voltage source +V$_{CC}$ through a diode 8 and resistor 7. In particular, the cathode of diode 8 is connected to the collector of transistor 3 and the anode of diode 8 is connected to voltage source +V$_{CC}$ through resistor 7. The collector of transistor 4 is connected to voltage source +V$_{CC}$ through the series combination of the collector-emitter path of a transistor 9 and a resistor 10. In particular, the collector of transistor 9 is connected to the collector of transistor 4 and the emitter thereof is connected to voltage source +V$_{CC}$ through resistor 10. In addition, the base of transistor 9 is connected to the connection point between diode 8 and transistor 3. The signal converting circuit of FIG. 2 further includes an NPN transistor 11 having its base-collector circuit connected in parallel with the collector-emitter circuit of transistor 9 and which performs a current mirror function similar to that in the circuit of FIG. 1. A further PNP transistor 13 has its emitter connected to the emitter of transistor 11 through an optional resistor 12 and its base connected to ground through a bias voltage source 14. It should be appreciated that bias voltage source 14 provides a minimum potential level at the collector of transistor 9 so as to prevent the voltage at the collector of transistor 9 from rising to a value where transistor 9 is saturated, as a result of the difference between the collector current of transistor 9 and the current through resistor 10. Saturation of transistor 9 is, of course, undesirable since such saturation results in a decrease in the value of the current amplification factor h$_{fe}$ of transistor 9 with a consequent cessation of the current mirror operation of the signal converting circuit of FIG. 2. The collector of transistor 13 serves as the output of the signal converting circuit.

In like manner to the circuit of FIG. 1, when differential input signals are supplied to the bases of transistors 3 and 4 from input signal generator 1, the currents produced at the collectors of transistors 3 and 4 are equal to (I$_0$+Δi) and (I$_0$−Δi), respectively. It should be appreciated that the current through diode 8 and resistor 7 is thus also equal to (I$_0$+Δi) and the current at the collector of transistor 9 is equal to (I$_0$−Δi). Further, the emitter current of transistor 9 is substantially equal to the collector current of (I$_0$−Δi). This results, of course, since the collector current is equal to h$_{fe}$ I$_B$ and the emitter current is equal to (1+h$_{fe}$) I$_B$, where I$_B$ is the current at the base of transistor 9 and h$_{fe}$ is the current amplification factor of transistor 9 which has a value much greater than 1 (h$_{fe}$≫1). Accordingly, a base current flows to transistor 11 to activate the same so that a current I$_x$ flows through the collector of transistor 11.

Given that the voltage drop across diode 8 and the base-emitter voltage drop across transistor 9 are V$_{BE}$, the following equation can be obtained:

$$(I_0+\Delta i)R_7 + V_{BE} = (I_x + I_0 - \Delta i)R_{10} + V_{BE} \quad (1),$$

where R$_7$ and R$_{10}$ are the resistance values for resistors 7 and 10, respectively. By rearranging the terms of equation (1), the following equation for collector current I$_x$ can be obtained:

$$I_x = \frac{(R_7 - R_{10}) I_0 + (R_7 + R_{10}) \Delta i}{R_{10}} \quad (2)$$

Thus, for example, if R$_7$=R$_{10}$, I$_x$=2Δi, and if R$_7$=2R$_{10}$, I$_x$=I$_0$+3Δi, where I$_x$ also constitutes the output current of the signal converting circuit of FIG. 2 through the collector of transistor 13. It should thus be appreciated from equation (2) that the signal converting circuit of FIG. 2 provides a current gain or amplification which is dependent on the ratio of the resistance values of resistors 7 and 10, without varying the value of bias current I$_0$ from current source 2.

Figure 3:
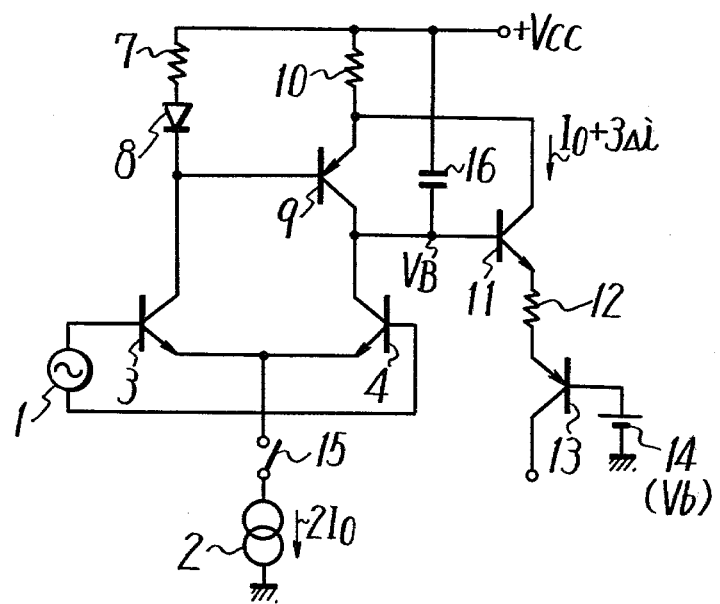
FIG. 3 is a circuit wiring diagram of a signal converting circuit according to another embodiment of this invention.

Referring now to FIG. 3, it will be seen that in another embodiment of a signal converting circuit according to this invention, elements corresponding to those described above with reference to the circuit of FIG. 2 are identified by the same reference materials. Thus, diode 8, resistors 7, 10 and 12, and transistors 3, 4, 9, 11 and 13 are constructed in an identical manner to the identically-numbered elements in the circuit of FIG. 2, and a description thereof will not be repeated herein. In this circuit, constant current source 2 is connected to the emitters of transistors 3 and 4 of the differential amplifier through a switch 15, whereby constant current $2I_0$ flows to such transistors only when switch 15 is rendered conductive. It should be appreciated that although switch 15 is shown as a single-pole, single-throw switch, such switch is preferably constructed as a semiconductor gating switch. Alternatively, constant current source 2 may be comprised of a transistor which also acts as a switch which is rendered operative when pulses of a certain level are supplied to the base thereof. Further, the signal converting circuit of FIG. 3 differs from the previously-described circuit of FIG. 2 in that a capacitor 16 is connected between voltage source $+V_{CC}$ and the base of transistor 11.

Thus, when switch 15 is rendered conductive, constant current $2I_0$ flows to transistors 3 and 4 so that the circuit of FIG. 3 is operated in the same manner as that of FIG. 2. For example, if $R_7 = 2R_{10}$, a current $I_x = I_0 + 3\Delta i$ flows through the collector-emitter path of transistor 11. In such case, if bias voltage source 14 generates a predetermined voltage $V_b$ and the resistance value of resistor 12 is $R_{12}$, the potential $V_B$ at the base of transistor 11 can be represented as follows:

$$V_B = V_b + (I_0 + 3\Delta i)R_{12} + 2V_{BE} \qquad (3),$$

where $V_{BE}$ is the base-emitter voltage drop across each of transistors 11 and 13. At such time, when switch 15 is rendered conductive, capacitor 16 stores a voltage which is the difference between the voltage $+V_{CC}$ and the voltage $V_B$ at the base of transistor 11.

When switch 15 is turned OFF or opened, transistors 3, 4 and 9 and diode 8 are also inoperative. However, because of the voltage previously stored by capacitor 16, the potential at the base of transistor 11 is maintained or held at the value $V_B$ defined by equation (3). Accordingly, transistor 11 is rendered conductive so that a current $(I_0 + 3\Delta i)$, in the case where $R_7 = 2R_{10}$, flows through the collector-emitter path of transistor 11 to the collector output of transistor 13. It should therefore be appreciated that an output current at the collector of transistor 13, which corresponds to the current when switch 15 is conductive, can be maintained or held with the signal converting circuit of FIG. 3.

Figure 4:
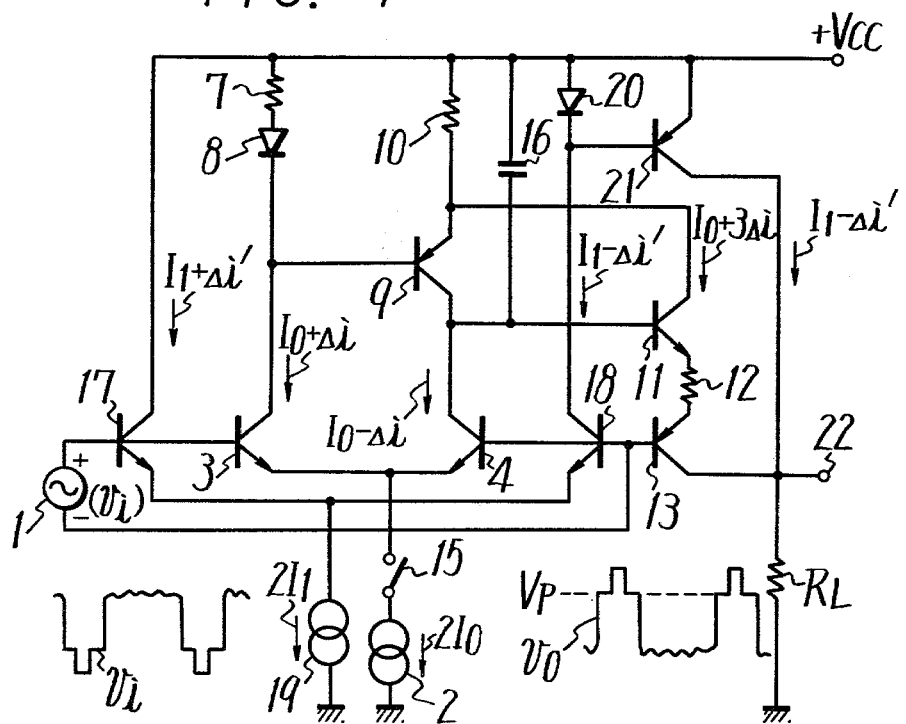
FIG. 4 is a circuit wiring diagram of a signal converting circuit according to still another embodiment of this invention.

Referring now to FIG. 4, it is seen that in another embodiment of a signal converting circuit according to this invention, elements corresponding to those described above with reference to the circuit of FIG. 3 are identified by the same reference numerals. The circuit of FIG. 4 is a pedestal clamp circuit which utilizes as its basis of operation the circuit of FIG. 3. In this circuit, a differential amplifier comprised of NPN transistors 3 and 4 have their emitters commonly connected through switching device 15 to current source 2 which generates a constant current $2I_0$. The collector of transistor 3 is connected through diode 8 and resistor 7 to voltage source $+V_{CC}$ and the collector of transistor 4 is connected through the collector-emitter path of PNP transistor 9 and resistor 10 to voltage source $+V_{CC}$, with the base of transistor 9 being connected to the collector of transistor 3. Further, a pair of video signals $+v_i$ of opposite phase are supplied to the bases of transistors 3 and 4 from signal generator 1. In like manner to the circuit of FIG. 3, an NPN transistor 11 has its collector connected to the emitter of transistor 9 and its base connected to the collector of transistor 4, and a PNP transistor 13 has its emitter connected to the emitter of transistor 11 through a resistor 12 and its collector connected to an output terminal 22. It should be appreciated that a voltage output at output terminal 22 is produced by the current flow through a load resistor $R_L$ connected between the collector of transistor 13 and ground. However, unlike the circuit of FIG. 3, the base of transistor 13 is connected to the same input of signal generator 1 as the base of transistor 4. In other words, the base of transistor 13 is not biased with a direct current but rather, is supplied with a video signal which is opposite in phase to the video signal supplied to the base of transistor 3.

Further, the circuit of FIG. 4 includes a second differential amplifier comprised of two NPN transistors 17 and 18 having their emitters commonly connected to a current source 19 which generates a constant current $2I_1$. The bases of transistors 17 and 18 are supplied with the same signals as are supplied to the bases of transistors 3 and 4, respectively. Further, the collector of transistor 17 is connected to voltage source $+V_{CC}$ and the collector of transistor 18 is connected to the same voltage source $+V_{CC}$ through a diode 20 and, in particular, the cathode of diode 20 is connected to the collector of transistor 18 and the anode thereof is connected to voltage source $+V_{CC}$. A second current mirror circuit comprised of diode 20 and a PNP transistor 21 having its emitter connected to voltage source $+V_{CC}$, its base connected to the collector of transistor 18 and its collector connected to output terminal 22 produces a current at its collector which is identical to the current flow at the collector of transistor 18. It should thus be appreciated that the current through the collectors of both transistors 13 and 21 are combined at output terminal 22 and such combined current flows through load resistor $R_L$.

In operation, switch 15 is rendered conductive by clamp pulses at the back porch of the video signal during each horizontal blanking period. When switch 15 is rendered conductive by such clamp pulses, an output current $(I_0 + 3\Delta i)$ flows through transistors 11 and 13 in the same manner as previously discussed in regard to the circuit of FIG. 3. At the same time, the second differential amplifier comprised of transistors 17 and 18 produces a current $(I_1 - \Delta i')$ at the collector of transistor 18. Because of the current mirror circuit comprised of diode 20 and transistor 21, the same current $(I_1 - \Delta i')$ flows through the collector of transistor 21, and such current is added to the current flowing through the collector of transistor 13, at output terminal 22. If the value of current $I_1$ is chosen so that, for example, $I_1 = -3I_0$, any variation in current $\Delta i'$, as a result of changes in input signal $v_i$ at the bases of the transistors of the two differential amplifiers, is equal to three times the resulting variation in current $\Delta i$, that is $\Delta i' = 3\Delta i$. This results, of course, because of the common connection of the bases of transistors 3 and 17 and transistors 4 and 18. Accordingly, at output terminal 22, that is, at the connection point between the collectors of transistors 13 and 21, the resultant current can be represented as follows:

$$I_{TOTAL} = (I_0 + 3\Delta i) + (3I_0 - 3\Delta i) = 4I_0 = I_1 + \tfrac{1}{3}I_1 \qquad (4).$$

Thus, the signal converting circuit of FIG. 4 acts on input signal $v_i$ so that the pedestal level or potential $V_p$ of the output video signal $v_O$ at output terminal 22 can be represented as follows:

$$V_p = (I_1 + \tfrac{1}{2}I_1)R_L \qquad (5).$$

When switch 15 is open or not conductive, that is, in the absence of any clamp pulse of the video signal being supplied thereto, the current at the output of transistor 13 is maintained or held at the value $(I_0 + 3\Delta i)$ as a result of the voltage storage by capacitor 16, in the same manner as previously described in regard to the circuit of FIG. 3. It is to be noted that the operation of switch 15 does not effect the operation of the second differential amplifier comprised of transistors 17 and 18. Accordingly, pedestal level $V_p$ is maintained at the value given in equation (5) even when switch 15 is not conductive. When switch 15 is again rendered conductive by a clamp pulse of video signal $v_i$, the pedestal level $V_p$ of the output video signal $v_O$ remains at the value given in equation (5) even if the pedestal level of the input video signal $v_i$ is varied as a result of variations in the average peak level (APL) of such signal which may occur, for example, from one line to the next. In this manner, the output video signal $v_O$ has its pedestal level $V_p$ always clamped to a value $(I_1 + \tfrac{1}{2}I_1) R_L$ at output terminal 22.

If current sources 2 and 19 are adjusted so that $I_1 = -2I_0$, current component $\Delta i' = 2\Delta i$ so that the pedestal level $V_p$ of output signal $v_O$ becomes $(I_1 + \tfrac{1}{2}I_1 + \Delta i) R_L$. In like manner, if the relative values between the constant currents from current sources 2 and 19 are chosen so that $I_1 = 4I_0$, current component $\Delta i' = 4\Delta i$ so that the pedestal level $V_p$ for the video signal $v_O$ becomes $(I_1 + \tfrac{1}{2}I_1 - \Delta i) R_L$. It should therefore be appreciated that the pedestal level $V_p$ can be set at a level which is related to variations in the pedestal level of the input video signal $v_i$ by varying the ratio between constant current $I_0$ and $I_1$. Thus, the pedestal clamp circuit of FIG. 4 according to this invention has the advantage that the DC transfer characteristic of the circuit can be set at a desired value without using any time constant circuits. It should be appreciated that although, as shown in FIG. 4, the pedestal level $V_p$ has been produced at the negative phase sequence of input video signal $v_i$, the positive phase sequence of input video signal $v_i$ may be used instead.

A further modification of the circuit of FIG. 4 may be in the elimination of the current mirror circuit comprised of diode 20 and transistor 21 and the adaptation of resistors 7 and 10, diode 8 and transistors 9 and 11 with respect to the collectors of transistors 17 and 18 which comprise the second differential amplifier. Further, constant current sources 2 and 19 may be eliminated and resistors having large resistance values may be substituted therefor.

Having described specific preferred embodiments of the invention with reference to the accompanying drawings, it is to be understood that the invention is not limited to those precise embodiments, and that various changes and modifications may be affected therein by one skilled in the art without departing from the scope or spirit of the invention as defined in the appended claims.

What is claimed is:

1. A signal converting circuit comprising:
   differential amplifier means having first and second outputs and producing first and second differential currents at said first and second outputs, respectively;
   output means for producing an output current in response to one of said first and second differential currents; and
   means for controlling the current gain of said signal converting circuit in response to said first and second differential currents, said means for controlling including a first circuit supplied with said first differential current and having first resistive means with a first resistance value, and a second circuit supplied with said second differential current and having second resistive means with second resistance value, the current gain of said signal converting circuit being controlled by the resistance values of said first and second resistive means.

2. A signal converting circuit according to claim 1; in which said first circuit further includes first semiconductor means connected in series with said first resistive means between a reference potential and said differential amplifier means and said second circuit includes second semiconductor means connected in series with said second resistive means between said reference potential and said differential amplifier means.

3. A signal converting circuit according to claim 2; in which said first semiconductor means includes a diode, said first resistive means includes a resistor connected between said reference potential and the anode of said diode, said second semiconductor means includes a transistor having an input and an output circuit, and said second resistive means includes a resistor connected in series with the output circuit of said transistor between said reference potential and said differential amplifier means, and the input of said transistor is further connected to the cathode of said diode.

4. A signal converting circuit according to claim 1; in which said differential amplifier means includes current source means for generating a constant current and first and second transistors, each having an input supplied with respective input signals, a first output at which said first and second differential currents, respectively, are produced, and a second output supplied with said constant current from said current source means.

5. A signal converting circuit comprising:
   differential amplifier means for producing first and second differential currents;
   a first circuit supplied with said first differential current and including first resistive means having a first resistance value;
   a second circuit supplied with said second differential current and including second resistive means having a second resistance value; and
   output means for producing an output current in response to one of said first and second differential currents, said output means including current mirror means for producing said output current, wherein the current gain of said signal converting circuit is controlled by the resistance values of said first and second resistive means and wherein changes in said one of said first and second differential currents is reflected by corresponding changes in said output current.

6. A signal converting circuit according to claim 5; in which said current mirror means includes a first transistor connected to said second circuit and having an output circuit for producing said output current in response to said second differential current.

7. A signal converting circuit according to claim 6; in which said second circuit includes a second transistor having an output circuit, and a resistor connected in series with the output circuit of said second transistor between a reference potential and said differential amplifier means, and said first transistor is a bipolar junction transistor having its base-collector circuit connected in parallel with the output circuit of said second transistor.

8. A signal converting circuit according to claim 6; in which said output means further includes a third transistor having an output circuit connected in series with the output circuit of said first transistor and having an input supplied with a bias voltage.

9. A signal converting circuit according to claim 6; in which said differential amplifier means includes switch means for enabling said differential amplifier means to produce said second differential current which is supplied to said second circuit, said first transistor has an input, and said output means further includes capacitive means connected between the input of said first transistor and a reference potential for biasing said first transistor to produce said output current when said differential amplifier means is not enabled so that said second differential current does not flow to said second circuit.

10. A signal converting circuit according to claim 9; in which said differential amplifier means includes a pair of transistors, each having an input, and in which video signals of opposite phase are supplied to the inputs of said pair of transistors, respectively, and clamp pulses in the horizontal blanking periods of said video signals are supplied to said switch means for enabling said differential amplifier means to produce said second differential current which is supplied to said second circuit.

11. A signal converting circuit comprising:
first differential amplifier means for producing first and second differential currents;
a first circuit supplied with said first differential current and including first resistive means having a first resistance value;
a second circuit supplied with said second differential current and including second resistive means having a second resistance value;
first output means for producing a first output current in response to one of said first and second differential currents, wherein the current gain of said signal converting circuit is controlled by the resistance values of said first and second resistive means;
second differential amplifier means for producing third and fourth differential currents;
second output means for producing a second output current in response to one of said third and fourth differential currents; and
means for combining said first output current and said second output current.

12. A signal converting circuit according to claim 11; in which each of said first-mentioned and second differential amplifier means includes first and second transistors, each transistor having an input and first and second outputs, and the first transistors of said first-mentioned and second differential amplifier means have their inputs connected in common and supplied with a first input signal, and the second transistors of said first-mentioned and second differential amplifier means have their inputs connected in common and supplied with a second input signal.

13. A signal converting circuit according to claim 12; in which said first-mentioned and second differential amplifier means include first and second current source means, respectively, which generate first and second constant currents, respectively, with said first constant current being supplied to the first outputs of the first and second transistors of said first-mentioned differential amplifier means and said second constant current being supplied to the first outputs of the first and second transistors of said second differential amplifier means, wherein said first and second differential currents are produced at the second outputs of the first and second transistors of the first-mentioned differential amplifier means and said third and fourth differential currents are produced at the second outputs of the first and second transistors of the second differential amplifier means.

14. A signal converting circuit according to claim 13; in which said first-mentioned differential amplifier means further includes switch means for interrupting the flow of said first constant current to the first outputs of the first and second transistors of the first-mentioned differential amplifier means; said first circuit includes a diode connected in series with said first resistive element between a reference potential and the second output of the first transistor of said first-mentioned differential amplifier means; said second circuit includes a transistor having an input connected to the second output of the first transistor of said first-mentioned differential amplifier means and an output circuit connected in series with said second resistive element between said reference potential and the second output of the second transistor of said first-mentioned differential amplifier means; said first-mentioned output means includes a current mirror transistor having an input connected to the second output of the second transistor of said first-mentioned differential amplifier means and an output circuit connected to the connection point between the transistor of said second circuit and said second resistive element, an output transistor having an output circuit connected in series with the output circuit of said current mirror transistor for producing said first-mentioned output current, and a capacitive element connected between said reference potential and the input of said current mirror transistor; and said second output means includes a current mirror circuit comprised of a diode connected between the second output of the second transistor of said second differential amplifier means and said reference potential and a transistor having an input connected to the second output of the second transistor of said second differential amplifier means and an output circuit for producing said second output current.

15. A signal converting circuit according to claim 12; in which said first and second input signals are video signals of opposite phase and said signal converting circuit clamps the pedestal level of said video signal to a reference level, wherein the combined first-mentioned and second output currents correspond to the clamped pedestal level.

* * * * *